US012677599B2

(12) United States Patent
Singh et al.

(10) Patent No.: US 12,677,599 B2
(45) Date of Patent: Jul. 7, 2026

(54) METHOD OF FABRICATING A SEMICONDUCTOR DEVICE

(71) Applicant: Microsoft Technology Licensing, LLC, Redmond, WA (US)

(72) Inventors: Amrita Singh, Delft (NL); Elvedin Memisevic, Lund (SE); Peter Krogstrup Jeppesen, Copenhagen (DK)

(73) Assignee: Microsoft Technology Licensing, LLC, Redmond, WA (US)

( * ) Notice: Subject to any disclaimer, the term of this patent is extended or adjusted under 35 U.S.C. 154(b) by 607 days.

(21) Appl. No.: 18/016,118

(22) PCT Filed: Jul. 16, 2020

(86) PCT No.: PCT/EP2020/070142
§ 371 (c)(1),
(2) Date: Jan. 13, 2023

(87) PCT Pub. No.: WO2022/012749
PCT Pub. Date: Jan. 20, 2022

(65) Prior Publication Data
US 2023/0276718 A1 Aug. 31, 2023

(51) Int. Cl.
*H10N 60/80* (2023.01)
*G06N 10/00* (2022.01)
(Continued)

(52) U.S. Cl.
CPC .............. *H10N 60/80* (2023.02); *G06N 10/00* (2019.01); *H10D 62/122* (2025.01); *H10N 60/01* (2023.02)

(58) Field of Classification Search
CPC ...... H10N 60/80; H10N 60/01; H10N 60/128; H10N 60/0912; H10N 60/12; G06N 10/00; G06N 10/40; H10D 62/122
See application file for complete search history.

(56) References Cited

U.S. PATENT DOCUMENTS 10,879,464 B2   12/2020  Jeppesen et al.
2020/0027030 A1*  1/2020  Freedman .............. H10N 60/01
(Continued)

FOREIGN PATENT DOCUMENTS

WO        2019099171 A2     5/2019
WO     WO-2019180267 A1 *   9/2019   ............. B82Y 10/00
(Continued)

OTHER PUBLICATIONS

Communication pursuant to Article 94(3) received in European Application No. 20743633.8, mailed on Oct. 29, 2025, 05 pages.
(Continued)

*Primary Examiner* — Ermias T Woldegeorgis
(74) *Attorney, Agent, or Firm* — Klarquist Sparkman, LLP

(57) ABSTRACT

A semiconductor device is fabricated by: forming a shadow wall on a substrate; subsequently growing a nanowire of semiconductor material on the substrate; and directionally depositing a layer of a further material on the nanowire from a direction selected such that the shadow wall casts a shadow on the nanowire, the shadow being a region in which the further material is not deposited. The nanowire is vertically orientated relative to the substrate. The shadow wall comprises a base portion and a bridge portion. The bridge portion overhangs the substrate and is supported by the base portion. Patterning of the further material may be achieved without the use of etching, thereby avoiding damage to the semiconductor. Also provided is a semiconductor-superconductor hybrid device; a quantum computing device comprising the semiconductor-superconductor hybrid device; and a shadow wall for controlling directional deposition of a material.

26 Claims, 6 Drawing Sheets

(51) Int. Cl.
    *H10D 62/10*      (2025.01)
    *H10N 60/01*      (2023.01)

(56)           References Cited

U.S. PATENT DOCUMENTS

2020/0027971 A1    1/2020   Freedman et al.
2021/0083167 A1*  3/2021   Jespersen ............. H10D 30/014

FOREIGN PATENT DOCUMENTS

WO      2021110274 A1    6/2021
WO      2021170251 A1    9/2021
WO      2021197590 A1   10/2021

OTHER PUBLICATIONS

International Search Report and Written Opinion for PCT/EP2020/070142, mailed Apr. 6, 2021, 11 pages.
Krogstrup et al., "Epitaxy of semiconductor-superconductor nanowires," Nature Materials, vol. 14, No. 4, Apr. 1, 2015, pp. 400-406.
Schmid, Heinz, "III-V material integration, IBM Research Zurich", Retrieved from: https://images.app.goo.gl/JG1nBZ3Liwwpsxf39, 2020, 2 Pages.
Carrad, et al., "Shadow lithography for in-situ growth of generic semiconductor/superconductor devices", In Repository of arXiv:1911.00460v1, Nov. 11, 2019, 10 Pages.
Dey, et al., "Single InAs/GaSb Nanowire Low-Power CMOS Inverter", In Journal of Nano Letters, vol. 12, No. 11, Oct. 8, 2012, pp. 5593-5597.
Gazibegovic, et al., "Epitaxy of Advanced Nanowire Quantum Devices", In Journal of Nature, vol. 548, Issue 7668, Aug. 24, 2017, pp. 1-35.
Khan, et al., "Highly Transparent Gatable Superconducting Shadow Junctions", In Journal of ACS Nano, May 12, 2020, 11 Pages.
Larrieu, et al., "Vertical nanowire array-based field effect transistors for ultimate scaling", In Journal of Nanoscale, vol. 5, Issue 6, Jan. 23, 2013, pp. 2437-2441
Schüffelgen, et al., "Selective area growth and stencil lithography for in situ fabricated quantum devices", In Journal of Nature nanotechnology, vol. 14, Issue 9, Sep. 2019, pp. 825-831.
Svensson, et al., "III-V Nanowire Complementary Metal-Oxide Semiconductor Transistors Monolithically Integrated on Si", In Journal of Nano letters, vol. 15, Nov. 23, 2015, pp. 7898-7904.
Vaitiekenas, et al., "Flux-induced topological superconductivity in full-shell nanowires", In Journal of Science, vol. 367, Mar. 30, 2020, 38 Pages.

\* cited by examiner

101 — Forming a shadow wall on a substrate, the shadow wall comprising a base portion and a bridge portion, wherein the bridge portion overhangs the substrate and the base portion supports the bridge portion.

102 — Subsequently growing a nanowire of semiconductor material on the substrate, wherein the nanowire is vertically orientated with respect to the substrate.

103 — Directionally depositing a layer of a further material on the nanowire from a direction selected such that the shadow wall cases a shadow on the nanowire.

Fig. 1

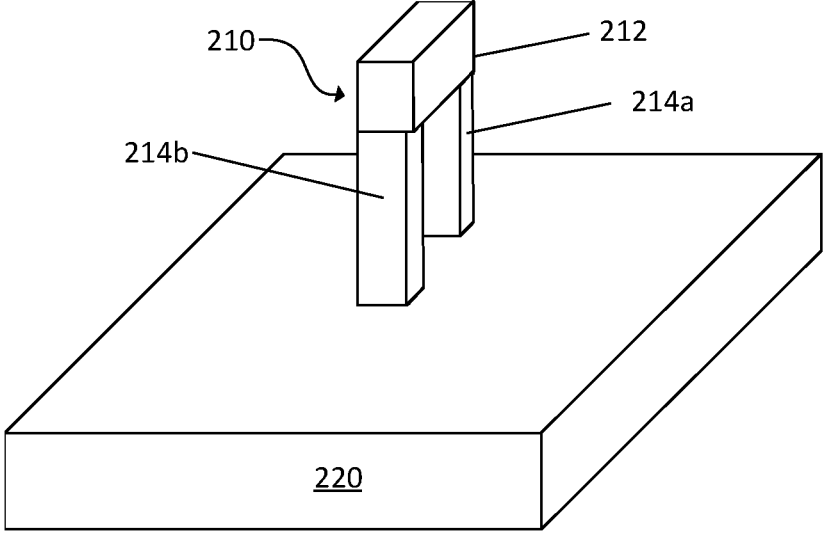

Fig. 2a

METHOD OF FABRICATING A SEMICONDUCTOR DEVICE

CROSS REFERENCE TO RELATED APPLICATIONS

This is the U.S. National Stage of International Application No. PCT/EP2020/070142, filed Jul. 16, 2020, which was published in English under PCT Article 21(2).

BACKGROUND

Semiconductor devices typically comprise further materials in addition to the semiconductor. A classical example of a semiconductor device is a field-effect transistor, FET. Along with the semiconductor channel, a typical FET includes at least a gate stack, which comprises a gate electrode and a gate dielectric arranged between the gate electrode and the semiconductor to prevent current flow from the gate electrode to the semiconductor.

Fabricating a semiconductor device typically involves patterning materials. By way of illustration, to form a gate stack of a FET, a dielectric layer and a metal layer may be deposited on a semiconductor and then etched selectively to form a desired shape.

A broad range of different semiconductor devices have been described. Of particular interest are semiconductor-superconductor hybrid devices. Such devices have applications in quantum computing, e.g., in topological quantum computing.

Topological quantum computing is based on the phenomenon whereby non-abelian anyons, in the form of "Majorana zero modes" (MZMs), can be formed in regions where a semiconductor is coupled to a superconductor. A non-abelian anyon is a type of quasiparticle, meaning not a particle per se, but an excitation in an electron liquid that behaves at least partially like a particle. An MZM is a particular bound state of such quasiparticles. Under certain conditions, these states can be formed close to the semiconductor-superconductor interface in a nanowire formed from a length of semiconductor coated with a superconductor. When MZMs are induced in the nanowire, it is said to be in the "topological regime". To induce this requires a magnetic field, conventionally applied externally, and also cooling of the nanowire to, or below, a temperature that induces supercon-ducting behaviour in the superconductor material. It may also involve gating a part of the nanowire with an electrostatic potential.

By forming a network of such nanowires and inducing the topological regime in parts of the network, it is possible to create a quantum bit (qubit) which can be manipulated for the purpose of quantum computing. A qubit is an element upon which a measurement with two possible outcomes can be performed, but which at any given time (when not being measured) can in fact be in a quantum superposition of the two states corresponding to the different outcomes.

To induce MZMs, the device is cooled to a temperature where the superconductor (e.g. aluminium) exhibits superconducting behaviour. The superconductor causes a proximity effect in the adjacent semiconductor, whereby a region of the semiconductor near the interface with the superconductor also exhibits superconducting properties. Topological phase behaviour is induced in the adjacent semiconductor as well as the superconductor. It is in this region of the semiconductor where the MZMs are formed.

Another condition for inducing the topological phase where MZMs can form is the application of a magnetic field in order to lift the spin degeneracy in the semiconductor. Degeneracy in the context of a quantum system refers to the case where different quantum states have the same energy level. Lifting the degeneracy means causing such states to adopt different energy levels. Spin degeneracy refers to the case where different spin states have the same energy level. Spin degeneracy can be lifted by means of a magnetic field, causing an energy level spilt between the differently spin-polarized electrons. This is known as the Zeeman effect. The g-factor refers to the coefficient between the applied magnetic field and the spin splitting. Typically, the magnetic field is applied by an external electromagnet.

An alternative route to creating topological materials and superconducting memory elements that does not require external magnetic (Zeeman) field involves combinations of semiconducting, superconducting, and ferromagnetic insulator materials hybridized into a single device.

For example, U.S. Ser. No. 16/246,287 has also disclosed a heterostructure in which a layer of a ferromagnetic insulator is disposed between the superconductor and semiconductor in order to internally apply the magnetic field for lifting the spin degeneracy, without the need for an external magnet. U.S. Ser. No. 16/246,287 indicates that an exchange field between the ferromagnetic insulator and the semiconductor causes a split in energy levels. Examples given for the ferromagnetic insulator included compounds of heavy elements in the form of EuS, EuO, GdN, $Y_3Fe_5O_{12}$, $Bi_3Fe_5O_{12}$, $YFeO_3$, $Fe_2O_3$, $Fe_3O_4$, $Sr_2CrReO_6$, $CrBr_3/CrI_3$, $YTiO_3$ (the heavy elements being Europium, Gadolinium, Yttrium, Iron, Strontium and Rhenium).

The fabrication of nanowire heterostructures comprising InAs and Al layers has been reported [Krogstrup et al., Nat. Mater. 14, 400 (2015)]. This method includes growing nanowires on a substrate; growing a metal coating on the nanowire; removing the nanowires from the substrate; and etching the aluminium layer selectively using electron beam lithography to allow for contact to the InAs semiconductor.

SUMMARY

In one aspect, there is provided a method of fabricating a semiconductor device on a substrate, which method comprises: forming a shadow wall on the substrate; subsequently growing a nanowire of semiconductor material on the substrate; and directionally depositing a layer of a further material on the nanowire from a direction selected such that the shadow wall casts a shadow on the nanowire, the shadow being a region in which the further material is not deposited; wherein the nanowire is vertically orientated with respect to the substrate; and wherein the shadow wall comprises a base portion and a bridge portion, wherein bridge portion overhangs the substrate and the base portion supports the bridge portion.

In another aspect, there is provided a semiconductor-superconductor hybrid device, comprising: a planar substrate; a nanowire of semiconductor material having a length, the nanowire extending vertically from the planar substrate; and first and second superconductor components capable of undergoing energy level hybridisation with the semiconductor material; wherein the first superconductor component is arranged on a lower portion of the length of the nanowire; wherein the second superconductor component is arranged on an upper portion of the length of the nanowire; and wherein the first and second superconductor components are vertically spaced from one another, defining a junction portion of the nanowire.

Another aspect provides a quantum computing device comprising the semiconductor-superconductor hybrid device.

A still further aspect provides a shadow wall for controlling directional deposition of a material, wherein the shadow wall is arranged on a substrate; wherein the shadow wall comprises a bridge portion and a base portion; wherein the bridge portion overhangs the substrate and the base portion supports the bridge portion; and wherein the base portion is ring shaped in plan.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which:

FIG. 1 is a flowchart outlining a method of fabricating a semiconductor device;

FIGS. 2a to 2c are schematic perspective views illustrating the stages of the method of FIG. 1;

FIGS. 1 to 4, 6 and 7 are schematic and are not to scale. Relative dimensions of components may be exaggerated for ease of representation.

DETAILED DESCRIPTION

Figure 2B:
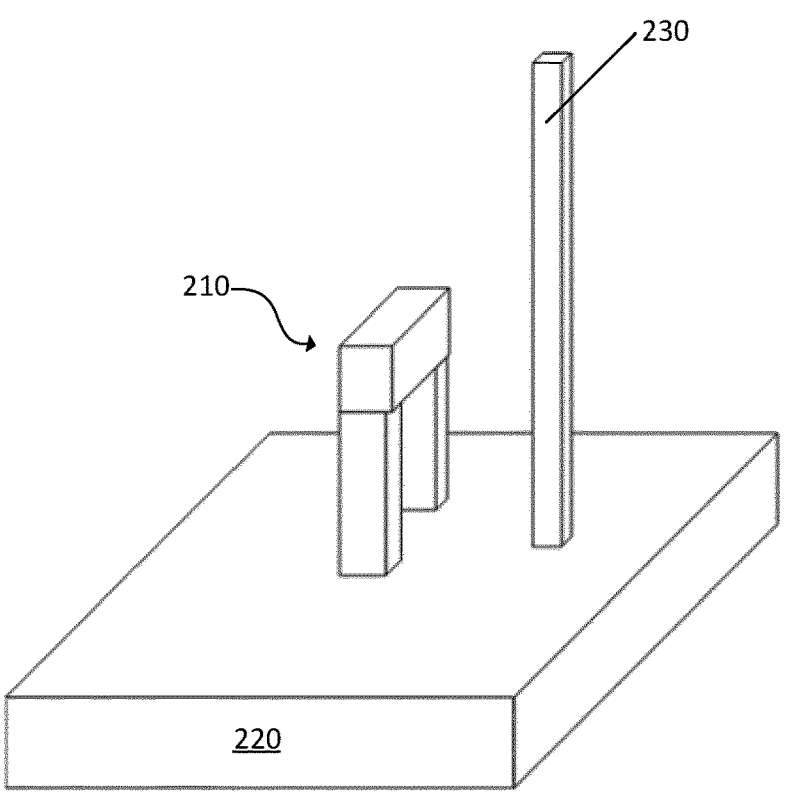

As used herein, the verb 'to comprise' is used as shorthand for 'to include or to consist of'. In other words, although the verb 'to comprise' is intended to be an open term, the replacement of this term with the closed term 'to consist of' is explicitly contemplated, particularly where used in connection with chemical compositions.

Directional terms such as "top", "bottom", "left", "right", "above", "below", "horizontal" and "vertical" are used herein for convenience of description and relate to the orientation shown the drawings. For the avoidance of any doubt, this terminology is not intended to limit orientation in an external frame of reference.

Geometric terms are used for convenience of description. Geometries may vary within manufacturing tolerances.

A "nanowire" is an elongate member having a nano-scale width, and a relatively large length-to-width ratio. A nanowire typically has a width of less than or equal to 100 nm, for example 50 to 100 nm. The length of the nanowire may be selected as appropriate depending on the nature of the device. Nanowires used in semiconductor-superconductor hybrid devices typically have lengths of the order of micrometres, e.g. at least 1 μm, or at least 10 μm. Nanowires used in classical devices, such as field-effect transistors, may have lengths in the range 300 to 500 nm.

The sides of a nanowire are referred to as facets.

The term "coupling" in the context of the present disclosure refers to the hybridisation of energy levels.

A "superconductor" is a material which becomes superconductive when cooled to a temperature below a critical temperature, $T_c$, of the material. The use of this term is not intended to limit the temperature during fabrication of a device.

A "semiconductor-superconductor hybrid structure" comprises a semiconductor component and a superconductor component which may become coupled to one another under certain operating conditions. In particular, this term refers to a structure capable of showing topological behaviour such as Majorana zero modes, or other excitations useful for quantum computing applications. The operating conditions generally comprise cooling the structure to a temperature below the $T_c$ of the superconductor component, applying a magnetic field to the structure, and applying electrostatic gating to the structure. Generally, at least part of the semiconductor component is in intimate contact with the superconductor component, for example the superconductor component may be epitaxially grown on the semiconductor component. Certain device structures having one or more further components between the semiconductor component and superconductor component have however been proposed.

The term "adatom" as used herein refers to an atom which is adsorbed on a surface.

A "directional deposition process" is a process that uses a directed beam of material or a precursor of the material to deposit material on a surface. In a directional deposition process, the position at which material is adsorbed onto the surface is determined by the direction of the beam. Examples of processes which may be used to achieve directional deposition include molecular beam epitaxy, thermal evaporation, and electron beam evaporation.

The content of all documents cited herein is hereby incorporated by reference in its entirety.

The inventors have found that there are limitations associated with the use of etching to pattern materials such as metals and ferromagnetic insulators deposited on semiconductor nanowires. The possible combinations of semiconductor and further materials are limited by the availability of an etchant which is capable of etching the further materials without destroying the nanowire.

Even when an acceptable etchant is available, etching processes may damage the nanowire. For example, etching may induce chemical or physical changes at the surface of the nanowire. Such changes may degrade the interface between the nanowire and the further material. A high-quality interface is desirable for both classical and quantum semiconductor devices.

In the context of classical semiconductor devices, such as field-effect transistors, surface degradation may make it necessary to operate the device at a higher voltage than would otherwise be required. There are various drawbacks associated with increasing the operating voltage. For example, power dissipation may be increased leading to heating and limiting device performance. Increased voltage can cause charge build-up may occur in the dielectric layer of the gate stack, compromising device stability.

Surface damage can also be correlated with increased scattering in the channel and reduction in the current through the device.

Quantum semiconductor devices, e.g. semiconductor-superconductor hybrid devices, are even more sensitive to surface defects. In addition to the problems observed in classical devices, surface defects in a semiconductor-superconductor hybrid device can render the device unusable by impairing coupling between the semiconductor and superconductor.

Existing fabrication methods based on vertical nanowires often require transfer of the nanowires from a growth substrate to another substrate. The inventors have observed that processes which involve transferring nanowires from their growth substrate have limited scalability. Cleaving and subsequently positioning nanowires is delicate and time-consuming. As device complexity increases and the number of nanowires increases, fabrication methods involving cleaving and positioning nanowires become less and less practical.

Provided herein is a method of fabricating a semiconductor device on a substrate which may address one or more of these limitations. The method will now be described with reference to FIGS. 1 and 2 simultaneously.

At block 101, a shadow wall is formed on a substrate. Shadow walls may also be referred to as smart walls. The shadow wall will be used in a subsequent step to control directional deposition of a material, by blocking deposition in a shadowed region. An example shadow wall 210 arranged on a substrate 220 is shown in FIG. 2a.

In the present example, substrate 220 comprises a wafer of semiconductor material. More complex substrates, further comprising additional components or layers arranged on the wafer, may be used.

The substrate 220 may have a planar surface. In other words, the substrate 220 may have a flat surface, free of surface topology such as channels, trenches, protrusions, mesas and the like. Surface topology may have a negative effect on the growth of the semiconductor nanowire.

Shadow wall 210 comprises a bridge portion 212 and base portions 214a, 214b.

Bridge portion 212 overhangs substrate 220. In other words, a part of bridge portion 212 extends over a part of the substrate 220 and is separated from the substrate 220 by a gap. During directional deposition of a material, the bridge portion 212 blocks the beam of material. The size and shape of the shadow cast by the shadow wall is determined by the shape of the bridge portion 212.

Since bridge portion 212 overhangs the substrate 220, the impact of the shadow wall on the growth of the nanowire may be reduced. During growth of a semiconductor nanowire, atoms are adsorbed onto the surface of the substrate. Adsorbed atoms are referred to as adatoms. Adatoms may diffuse on the surface of the substrate, performing a random walk. The random walk covers a distance which is referred to as the surface diffusion length of the adatoms. An adatom remains on the surface for a certain time period, referred to as its surface lifetime, after which period the adatom either desorbs from the surface, or becomes incorporated into a crystal at some position on the surface. The flow rate, also referred to as flux, of adatoms across the surface is one parameter which may influence the growth of the semiconductor. By providing an overhang, diffusion of adatoms under the bridge portion 212 during growth of a semiconductor nanowire may be made possible.

Base portions 214a, 214b support the bridge portion 212.

The shadow wall is formed before growing the semiconductor nanowire. Any suitable technique may be used. Techniques which avoid modifying the surface of the substrate may be preferred, because this may make it easier to grow the nanowire subsequently.

For example, the shadow wall may be formed using a lithographic process. An illustrative lithographic process for forming a shadow wall comprises forming a first resist on the substrate; selectively exposing a portion of the first resist and developing the first resist to form a mask defining a channel; forming a second resist in the channel and over the mask, selectively exposing a portion of the second resist, developing the second resist, and removing the mask to form the shadow wall.

Resists may be formed by spin-coating or spray-coating, for example.

The channel in the first resist defines the shape and position of the base portion of the shadow wall. The second resist is exposed selectively to define the shape of the bridge portion of the shadow wall.

The first resist may be a positive resist. A positive resist is one which becomes more soluble in a developer solvent once exposed to an electron beam. Selecting a positive resist as the first resist may simplify the fabrication of the shadow wall.

The first resist may be an electron beam resist. Electron beam lithography may allow higher resolution than other lithographic techniques, such as photolithography.

Examples of positive electron beam resists include acrylate polymers and copolymers. For example, the positive electron beam resist may be a poly(methylmethacrylate), a methylmethacrylate-methacrylic acid copolymer, or a copolymer of chloromethyl methacrylate and methylstyrene. Copolymers of chloromethyl methacrylate and methylstyrene are commercially available under the trade name CSAR. In particular, the first resist may be a poly(methylmethacrylate), PMMA.

The conditions for exposure and development of the first resist may be selected as appropriate based on the resist chosen. For example, where the first resist comprises a poly(methylmethacrylate), a developer comprising a mixture of methyl isobutyl ketone and isopropyl alcohol may be used.

The second resist may be a negative resist, i.e. a resist which becomes less soluble in a developer when exposed. The second resist may be a negative electron beam resist.

When the second resist comprises a negative resist, exposing the second resist comprises exposing the parts of the second resist which are in the channel in the mask. The exposed parts in the channels form the base portions of the shadow wall. The shape of the bridge portion of the shadow wall may be defined by exposing corresponding parts of the second resist that extend over the mask.

The second resist may be selected such that the shadow wall will comprise an inorganic material. The second resist may, for example, comprise a silsesquioxane such as hydrogen silsesquioxane ("HSQ") or methyl silsesquioxane ("MSQ"). Exposing an HSQ to an electron beam converts the HSQ into a silicon oxide.

The second resist may be developed using a developer which does not attack the mask. In an example where the first resist comprises an acrylate polymer or copolymer such as a poly(methylmethacrylate), the developer for the second resist may comprise a base. The base may comprise a base, for example tetramethylammonium hydroxide ("TMAH"), potassium hydroxide or sodium hydroxide. Various developers are commercially available. Illustrative TMAH-based developers are available under the trade names MF-321 and MF-322.

Removing the mask may comprise stripping the first resist. Any appropriate technique for resist stripping may be used, provided that the shadow wall remains intact. Examples include the use of a solvent in combination with critical point drying, or the use of an oxygen plasma. In implementations where a poly(methylmethacrylate) is used as the first resist, the solvent may be acetone, for example.

At block 102, a nanowire of semiconductor material is grown on the substrate. The nanowire is orientated vertically with respect to the substrate.

A nanowire is a structure which may be modelled as 1-dimensional. A nanowire has a length which is many times larger than its other two dimensions. The nanowire is vertically orientated when its length direction is substantially perpendicular to the surface of the substrate.

Figure 2C:
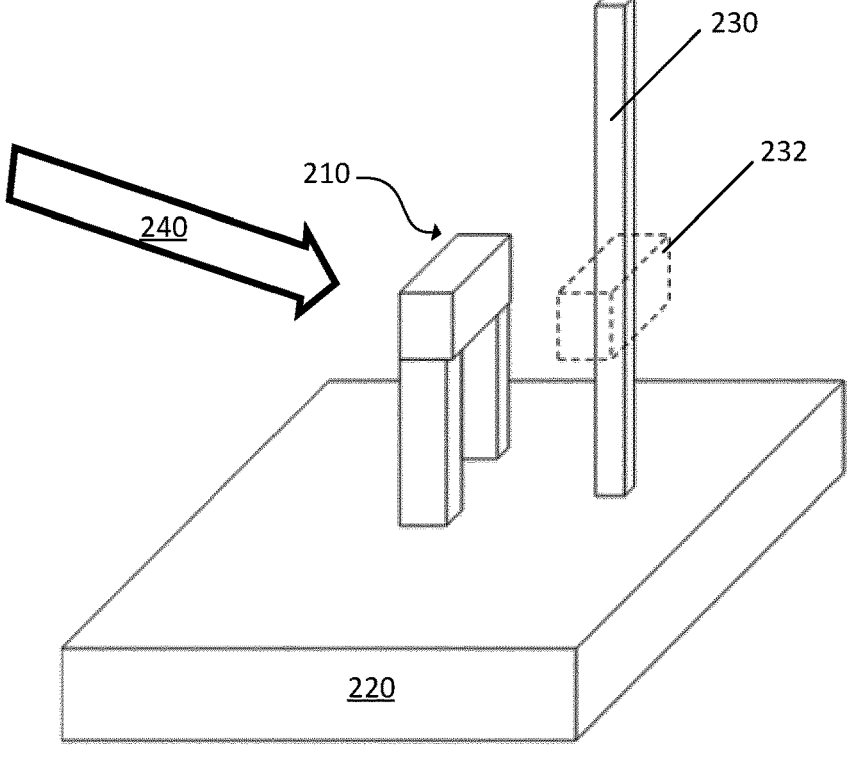

An illustrative example of the product of this operation is shown in FIG. 2b. FIG. 2b illustrates a nanowire 230 extending vertically from the substrate 220. In other words, the length axis of the nanowire is perpendicular to the substrate. The nanowire 230 is spaced from the shadow wall 210.

The nanowire may be grown epitaxially on the substrate. One example of a process useful for growing vertically orientated nanowires is the vapour-liquid-solid, VLS, process. VLS uses a liquid catalyst in combination with chemical vapour deposition to grow the nanowire. In a VLS process, the position at which the nanowire grows may be controlled by positioning a seed particle on the nanowire. Seed particles may be positioned with high precision through the use of techniques such as electron beam lithography/lift-off, nano imprinting, etc.

Alternative processes may be used to grow the vertically-orientated nanowire. One example is template growth, also referred to as selective area growth. Selective area growth uses a mask to control where the nanowire will grow. By configuring the mask openings appropriately, and selecting appropriate growth conditions, the nanowire may be grown vertically.

The nature of the semiconductor material is not particularly limited, and may be selected as desired.

For example, the nanowire may comprise a III-V semiconductor material. Illustrative III-V semiconductor materials include those of Formula 1:

$$InAs_xSb_{1-x} \qquad \text{(Formula 1)}$$

where x is in the range 0 to 1. In other words, the semiconductor may comprise indium antimonide (x=0), indium arsenide (x=1), or a ternary mixture comprising 50% indium on a molar basis and variable proportions of arsenic and antimony (0<x<1).

Another class of useful semiconductor materials is II-VI semiconductor materials. Examples of II-VI semiconductor materials include lead telluride and tin telluride.

At block 103, a layer of a further material is deposited on the nanowire by directional deposition. The deposition is from a direction selected such that the shadow wall casts a shadow on the nanowire. This operation is further illustrated in FIG. 2c.

During the directional deposition, shadow wall 210 partially obstructs beam of material 240, thereby forming a shadow region 232 on the nanowire 230. Shadow region 232 is a region where the material is not deposited. The material is deposited selectively on the unshadowed regions of the nanowire, i.e. those regions outside shadow region 232.

Facets of the nanowire which do not face the beam 240 will not receive the material. Material may be deposited from more than one direction to cover additional facets. For example, the substrate may be rotated, or the source of the beam may be moved.

Control over where the material is deposited may be achieved by controlling the shape of the shadow wall(s) and the beam direction(s).

The nature of the further material to be deposited is not particularly limited. Any material that is compatible with a directional deposition process may be used. Examples of further materials include metals, superconductor materials, ferromagnetic insulators, and dielectric materials.

Any number of layers may be deposited. For example, two or more layers of independently-selected materials may be deposited. The positions at which each material is deposited may be independently selected by controlling the shape of the shadow wall(s) and the beam direction(s).

For example, a layer of ferromagnetic insulator and a layer of superconductor material may each be deposited.

Since chemical etching of the further material may be avoided using the present methods, an improved interface between the semiconductor and the further material may be achieved. This property is useful in the fabrication of a very broad range of semiconductor-based devices.

Use cases include the fabrication of classical semiconductor devices, such as transistors, particularly field effect transistors; spintronic devices; high speed electronic devices; low dissipation electronic devices (also referred to as step-slope devices); and semiconductor-superconductor hybrid devices for quantum computing. Devices comprising combinations of semiconductor components may be fabricated. Of particular interest are quantum computing devices comprising a combination of semiconductor-superconductor hybrid components and classical components.

The surface of the semiconductor in a channel or junction region of the device may be kept free of deposited material.

An unmodified surface may allow for an improved interface. For example, in the case of the fabrication of a gate-stack, a good interface between the semiconductor and further material may allow an electrostatically gated device operable at reduced gate voltages to be obtained. This is particularly relevant for low dissipation electronic devices, and for devices comprising superconductor components, where thermal budget is limited since the operating temperature is limited by the critical temperature of the superconductor.

Since the nanowire may remain attached to the substrate during the fabrication process, device scalability may be improved because there is no need to cleave the nanowire from the substrate and to position the nanowire on a new substrate. This may open avenues for scalable and integrated circuits for future quantum computers.

Examples of shadow walls useful in the practice of the method will now be described with reference to FIGS. 3 and 4.

Figure 3A:
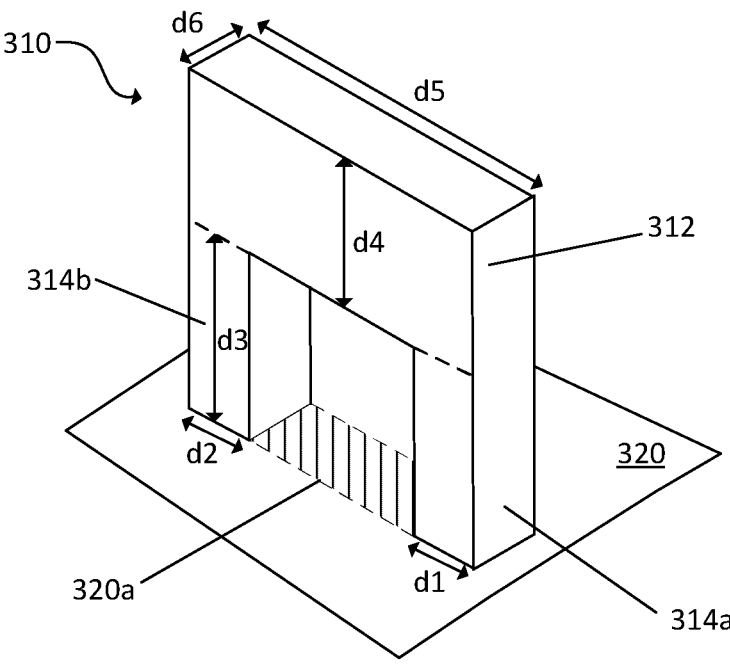
FIG. 3a is a schematic perspective view of an illustrative shadow wall arranged on a substrate.

FIG. 3a shows an illustrative example of a shadow wall 310 arranged on a substrate 320. The illustrated shadow wall 310 includes two base portions 314a, 314b and a bridge portion 312.

The two base portions 314a, 314b are arranged on substrate 320. Base portions 314a, 314b are in the form of pillars, extending upwardly from the substrate 320. The base portions 314a, 314b are configured to support the bridge portion 312.

The bridge portion 312 spans the base portions 314a, 314b. The bridge portion 312 overhangs the substrate 320. In other words, a part of bridge portion 312 extends over a part 320a of the substrate 320 and is separated from the substrate 320 by a gap.

Figure 3B:
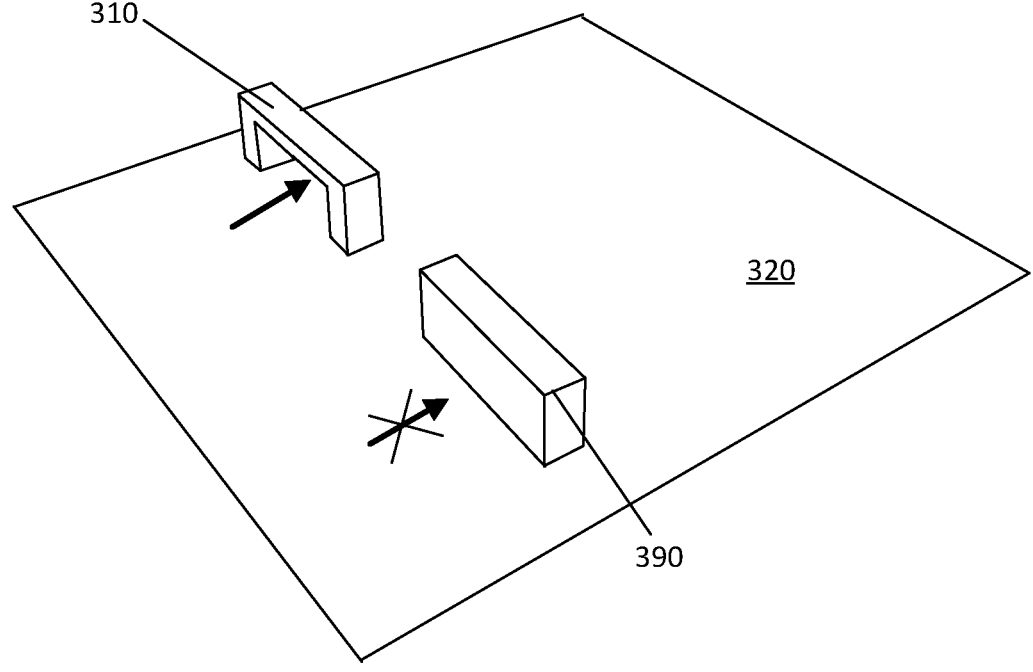
FIG. 3b is a schematic illustration comparing adatom flow across the surface of a substrate in the presence of a shadow wall as shown in FIG. 3a with adatom flow in the presence of a comparative block-shaped shadow wall.

During growth of the semiconductor nanowire, adatoms may diffuse across the surface of substrate 320, passing through part 320a. Interference with the growth by the shadow wall may therefore be reduced in comparison to the use of a shadow wall in the form of a block. This is illustrated in FIG. 3b: shadow wall 310 allows adatom flow (illustrated by the arrows) underneath the bridge portion; whereas comparative shadow wall 390 blocks the adatom flow.

During subsequent directional deposition of an additional material, the bridge portion 312 blocks the beam of material thereby creating the desired shadow region.

The dimensions d1, d2, d3, d4, d5 of the various portions of the shadow wall are not particularly limited and may be selected as appropriate depending upon the size of shadow desired. Widths d1, d2 of the base portions 314a, 314b are desirably as small as possible. The height d3 of the base portions 314a, 314b is typically less than or equal to 900 nm, and the overall height (d3+d4) of the shadow wall is typically less than or equal to 1.5 μm. The distance between the base portions may be in the range 300 nm to 3 μm. Dimensions d4, d5, d6 of the bridge portion may be adjusted as desired.

Since the shadow wall produces reduced interference in the growth of the nanowire, the shadow wall may be arranged closer to the intended location of the nanowire. For example, a spacing between the base portion of shadow wall 310 and the location for growing the semiconductor nanowire may be as small as 200 nm, or even less.

Various modifications may be made to the structure illustrated in FIG. 3a. The configurations of the bridge portion 312 and base portions 314a, 314b may be varied independently from one another, allowing significant design flexibility.

Illustrative examples of shadow wall configurations are shown in FIGS. 4a to 4e. Each of FIGS. 4a to 4e shows a respective shadow wall 410a to 410e positioned relative to a nanowire 430.

In each of the illustrated examples, nanowire 430 is depicted as having a square cross-section, with four facets. The principles described herein are applicable to nanowires of any cross-section. In practice, the shape of the cross-section of the nanowire is determined by the lowest surface energy where symmetry reflects the crystal structure of the material chosen.

A shadow wall may be configured to shadow any number of facets of the nanowire. For example, shadow wall 410a of FIG. 4a has a bridge portion which is L-shaped in plan. This shadow wall is capable of shadowing two facets of nanowire 430.

Figures 4A, 4B, 4C, 4D:
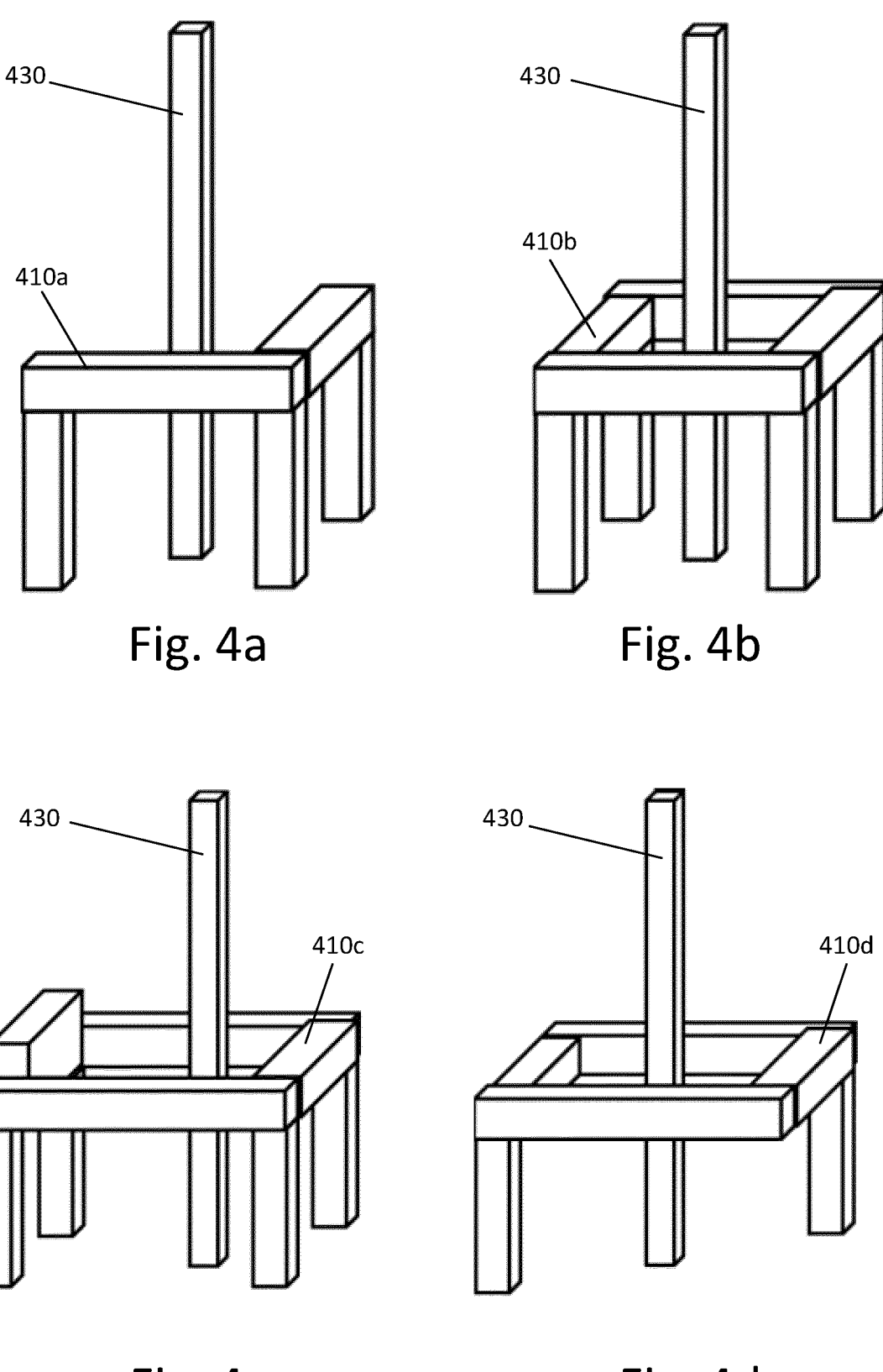
FIGS. 4a to 4e are schematic perspective views illustrating various shadow walls, each positioned relative to a nanowire.

FIG. 4b shows an example shadow wall 410b which surrounds all facets of nanowire 430. Providing a shadow wall which surrounds all facets of the nanowire is useful in implementations where a full shell of further material is to be deposited on unshadowed portions of the nanowire. The shadow region may correspond to a junction portion such as portion 736 of FIG. 7, discussed in more detail below.

Providing a full shell of further material may be advantageous for some implementations. The present methods may allow a full shell to be deposited on a selected portion of the nanowire without the use of etching. Avoiding the use of etching may allow a good interface between the nanowire and further material, with the shadowed region defining a channel or junction region of the nanowire having a good quality surface.

In implementations where the further material is a superconductor material and the semiconductor device is a semiconductor-superconductor hybrid device, providing a full shell may allow the semiconductor-superconductor hybrid device to be operated at lower applied magnetic fields. The effects of using a full shell of superconductor material are discussed in more detail in, for example, US2020/027030 A1.

In implementations where the further material is to act as a gate electrode, a full shell may allow for more effective gating since an electric field may be applied to the nanowire from all of its facets. This may be referred to as a gate-all-around structure. This gate geometry may allow for more effective electrostatic gating of the semiconductor nanowire.

FIG. 4c illustrates a further example of a shadow wall 410c. Similar to the example of FIG. 4b, shadow wall 410c surrounds a nanowire 430. Shadow wall 410c differs from shadow wall 410b in that one side of the bridge portion of the nanowire includes a protrusion, i.e., is taller than the other sides of the bridge portion. Thus, one facet of the nanowire would have a larger shadowed region than the remaining facets when a material is deposited on the nanowire 430 directionally.

FIG. 4c illustrates that different parts of the bridge portion may have different configurations, allowing control over the shape of different parts of the shadow region.

Another example of a shadow wall 410d is shown in FIG. 4d. In the FIGS. 4b and 4c examples, each corner of the bridge portion is supported by a corresponding base portion. Shadow wall 410d is, in contrast, supported by two base portions rather than four.

FIG. 4d illustrates that the configuration of the base portions may vary. The number and positioning of base portions may be selected as desired provided that the base portions are capable of supporting the bridge portion. It may be desirable to minimise the footprint of the base portions so as to maximise adatom flow under the bridge portion during growth of the nanowire.

Figure 4E:
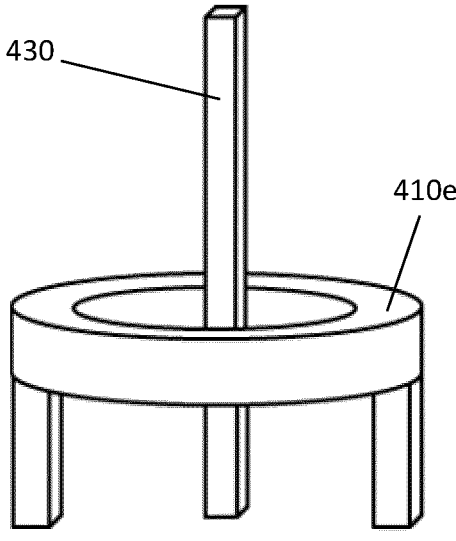

A still further example of a shadow wall 410e is shown in a FIG. 4e. Like shadow wall 410b, shadow wall 410e surrounds the nanowire 430. Shadow wall 410e differs from shadow all 410b in that the shadow wall has a ring-shaped bridge portion, rather than a hollow square shape. The ring is centred on the nanowire.

It has been found that providing a ring-shaped shadow wall improves the quality of the grown nanowire. The growth of semiconductor nanowires is sensitive to changes in the environment around the nanowire. If the environment is anisotropic, then defects may be introduced. An anisotropic environment may make material flow inhomogeneous, which may make it more difficult to optimize growth conditions. Without wishing to be bound by theory, it is believed that by providing a ring-shaped shadow wall all facets of the nanowire will experience the same conditions during growth.

Figure 5:
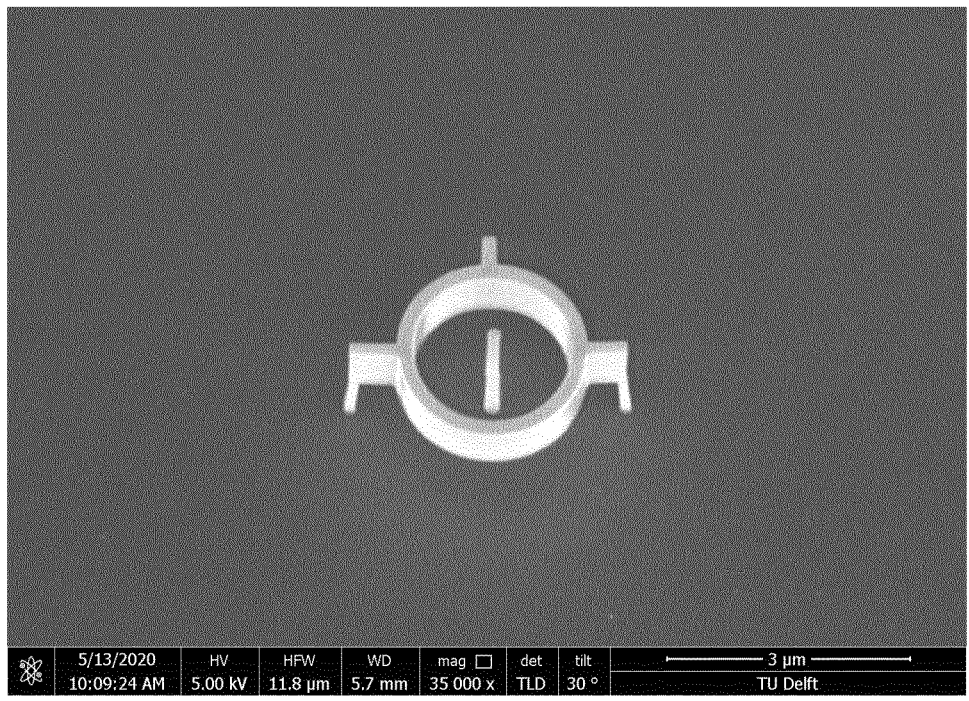
FIG. 5 is a scanning electron microscopy, SEM, micrograph showing a shadow wall the type shown in FIG. 4e and a nanowire of hydrogen silsesquioxane to illustrate how a semiconductor nanowire would be positioned relative to the shadow wall.

A scanning electron microscopy, SEM, micrograph of an example shadow wall and nanowire of HSQ positioned relative to the shadow wall is shown in FIG. 5. The shadow wall of this example is of the type shown in FIG. 4e.

More complex patterns of the further material on that the nanowire may be achieved by using an array comprising a plurality of shadow walls. An example array is illustrated in FIG. 6.

Figure 6:
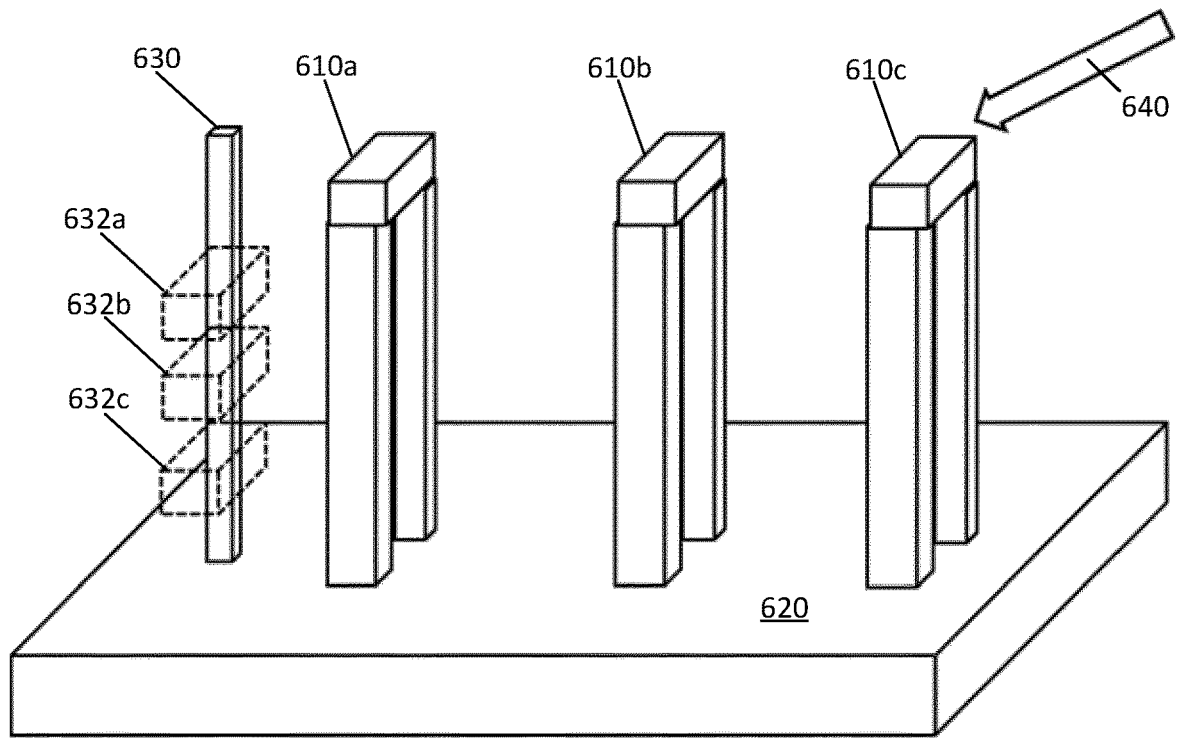
FIG. 6 is a schematic perspective view illustrating the use of an array of shadow walls.

FIG. 6 shows a set of three shadow walls 610*a*, 610*b*, 610*c*. These shadow walls are each of the type described with reference to FIG. 3, and are arranged in a row. When a beam of material 640 is directed towards the shadow walls 610*a*, 610*b*, 610*c*, respective shadows 632*a*, 632*b*, 632*c* are cast on the nanowire 630.

One example use case for an array of shadow walls is in the fabrication of a semiconductor-superconductor hybrid device having a plurality of hybrid portions arranged on the same nanowire and separated from one another by junction portions. A junction portion is a portion of semiconductor which is not hybridised to a superconductor. Junction portions are useful in quantum computing applications, because they can be electrostatically gated to allow control over the device, for example.

Arranging a plurality of hybrid portions on the same nanowire may be useful for scaling up semiconductor-superconductor hybrid devices. For example, it may be possible to arrange a greater density of hybrid portions on a given chip. It may be possible to reduce the number of interconnects required, by allowing more functional sections to be arranged on a given nanowire. Reducing the number of interconnects may allow operational stability of the device to be improved, for example by reducing parasitic capacitance.

Although FIG. 6 shows three shadow walls each having the same shape, this is merely illustrative. Any number of shadow walls may be used. The shape of each shadow wall may be independently selected in order to obtain the desired shadow.

A plurality of shadow walls may be arranged on the substrate, with the shape and position of each shadow wall being independently selected. A plurality of nanowires may be grown on the substrate. The shadowing of individual nanowires may be independently controlled by configuring the shapes and positions of the shadow walls. This may allow different types of components to be fabricated on substrate, which may be useful for integration or scale-up of devices.

An example of a semiconductor-superconductor hybrid device which may be fabricated using the present methods will now be explained with reference to FIG. 7.

Figure 7:
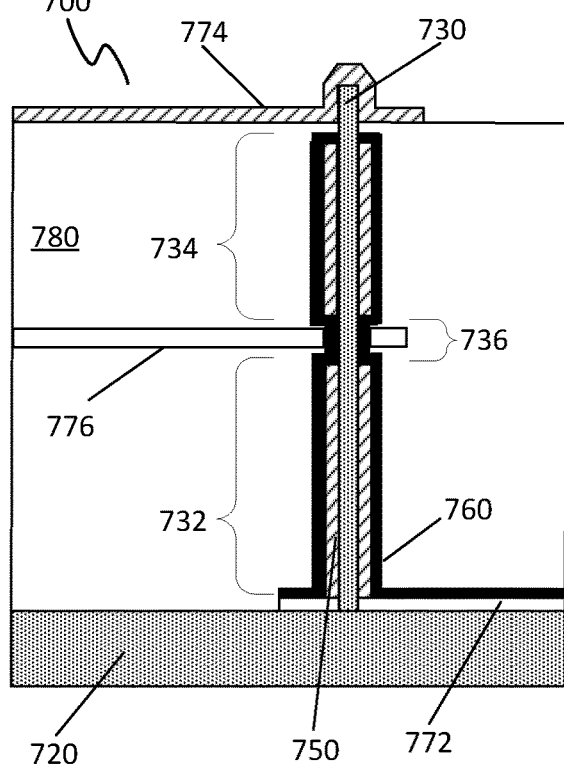
FIG. 7 is a simplified schematic cross-sectional view of a semiconductor-superconductor hybrid device.

FIG. 7 shows a semiconductor-superconductor hybrid device 700. The device 700 is arranged on a substrate 720. Substrate 720 in this example is a wafer of semiconductor material.

A vertically-oriented nanowire 730 extends from the surface of substrate 720. A lower portion 732 and an upper portion 734 of the nanowire 730 are each provided with a full shell of superconductor material 750. In use, energy level hybridisation between the semiconductor and superconductor is induced in portions 732 and 734. Providing a full shell of superconductor material 750 may allow the device to be operated in a weaker magnetic field compared to a device in which fewer facets are provided with superconductor material 750.

The lower portion of the nanowire 732 is spaced from the upper portion of the nanowire 734 by a junction portion 736. Junction portion 736 is a part of the nanowire which is not configured to hybridise with a superconductor material.

The device 700 further includes electrical contacts 772, 774 connected to respective ends of the nanowire. The electrical contacts allow the device to be connected to further components.

The nature of the electrical contacts is not particularly limited. For example, the electrical contact 772 at the bottom end of nanowire 730 may comprise a metal or a semiconductor. In implementations where a metal is used, the metal may be a normal conductor or a superconductor. In implementations where a semiconductor is used, the semiconductor may be in the form of a horizontally-orientated nanowire.

Electrical contact 774 at the top end of the nanowire 730 may comprise a metal. The metal may be a normal conductor or a superconductor.

The device further includes a gate electrode 776 for electrostatically gating the nanowire 730 in the junction portion 736.

The nanowire 730 and superconductor material 750 are covered by a layer of dielectric 760. In the junction portion 736, the dielectric 760 acts as a gate dielectric, preventing flow of current from the gate electrode 776 into the nanowire 730.

The nanowire 730, bottom electrical contact 772 and gate electrode 776 are embedded in a dielectric filler 780. The dielectric filler 780 may comprise a polymer, such as polymethylmethacrylate, hydrogen silsesquioxane, or a propylene glycol monomethyl ether acetate-based photoresist. A commercially available example of a propylene glycol monomethyl ether acetate-based photoresist is Microposit S1800. The dielectric filler 780 provides physical support for the nanowire, gate electrode 776 and top electrical contact the top of the nanowire 774.

By allowing two or more semiconductor-superconductor hybrid portions 732, 734 to be arranged vertically and separated by a junction 736, the semiconductor-superconductor hybrid device may be made more compact, allowing for a higher density of components. This may allow for the fabrication of more complex devices, with greater component densities.

It should be appreciated that the example shown in FIG. 7 is a simplified example. A quantum computer device may comprise a plurality of nanowires, which may be connected via electrical contacts 772 and/or 774. Although the illustrated example includes a single gate electrode 776, additional gate electrodes for gating additional portions of the device may be present. For example, one or more of the semiconductor-superconductor hybrid portions 732, 734 may be electrostatically gated.

It will be appreciated that the above embodiments have been described by way of example only.

More generally, according to one aspect disclosed herein, there is provided a method of fabricating a semiconductor device on a substrate, which method comprises: forming a shadow wall on the substrate; subsequently growing a nanowire of semiconductor material on the substrate; and directionally depositing a layer of a further material on the nanowire from a direction selected such that the shadow wall casts a shadow on the nanowire, the shadow being a region in which the further material is not deposited; wherein the nanowire is vertically orientated with respect to the substrate; and wherein the shadow wall comprises a base portion and a bridge portion, wherein bridge portion overhangs the substrate and the base portion supports the bridge portion.

By controlling the directional deposition of the layer of further material using the shadow wall, patterning of the layer of further material may be achieved without the use of a chemical etch. This may avoid degradation of the semiconductor material. Since the shadow wall overhangs the substrate, diffusion of adatoms across the surface of the substrate underneath the shadow wall is made possible. This may prevent the shadow wall from interfering with the growth of the nanowire and/or may allow for easier fabrication of further components after the growth.

The substrate may be planar. Since the directional deposition is controlled by the shadow wall, the introduction of topology such as trenches in the substrate may be avoided. Providing a planar substrate may provide more favourable growth conditions for the nanowire.

The substrate may be any structure on which the device is to be constructed. The substrate typically comprises a wafer of semiconductor material. A wafer is a single crystalline piece of material. One example wafer material is indium phosphide, which is a high band-gap semiconductor. Other examples of wafer materials include gallium arsenide, indium antimonide, indium arsenide, and silicon. The substrate may be a more elaborate workpiece, further comprising additional structures arranged on or over the wafer. The substrate may include layers of two or more materials.

The nanowire may be grown by a vapour-liquid-solid, VLS, process. The VLS process is one example of a process that allows for the growth of vertically oriented nanowires on a substrate. Templated growth is one example of an alternative process.

The directional deposition may form a full shell of the further material around an unshadowed portion of the nanowire. A full shell of material is a layer of material which covers every facet of the nanowire. Providing a full shell of the further material may be advantageous for some implementations. For example, in implementations where the device is a semiconductor-superconductor hybrid device, providing a full shell may allow the hybrid device to be operated at a lower magnetic field strength.

The nature of the further material is not particularly limited and may be selected as appropriate depending on the nature of the desired semiconductor device. Any material which is capable of being directionally deposited may be used. Since patterning of the further material is achieved by controlling deposition using a shadow wall rather than by chemical etching of deposited material, a wide variety of combinations of semiconductor materials and further materials may be used in the practice of the present method.

For example, the further material may be selected from a superconductor material, a metal, and a ferromagnetic insulator material.

The superconductor material may be an s-wave superconductor. Examples of superconductor materials include aluminium, niobium, lead, indium, and tin. The nanowire may comprise a material of Formula 1 as defined above, and the superconductor material may comprise aluminium.

Examples of ferromagnetic insulator materials include EuS, EuO, GdN, $Y_3Fe_5O_{12}$, $Bi_3Fe_5O_{12}$, $YFeO_3$, $Fe_2O_3$, $Fe_3O_4$, $Sr_2CrReO_6$, $CrBr_3/CrI_3$, and $YTiO_3$.

Examples of metals include gold, platinum and refractory metals. As used herein, the term "refractory metal" refers to a refractory metal having a melting point greater than or equal to 1850° C. at a pressure of 1 atm. Examples of refractory metals are titanium, vanadium, chromium, manganese, zirconium, niobium, molybdenum, technetium, ruthenium, rhodium, hafnium, tantalum, tungsten, rhenium, osmium and iridium. In particular, the refractory metal may be selected from niobium, molybdenum, tantalum, tungsten and rhenium.

The present methods are particularly useful for fabrication of semiconductor-superconductor hybrid devices. The further material may be in particular a superconductor material.

The number of layers of further material is not particularly limited. The method may comprise directionally depositing two or more layers of further materials. The further materials forming each layer may be independently selected.

For example, a layer of ferromagnetic insulator material and a layer of the superconductor material may be deposited.

In another example, the further materials may comprise a layer of dielectric, and a layer of metal. The dielectric may be deposited before the metal. In this way, a gate stack may be fabricated. The gate stack may be arranged as a full shell, in other words, as a gate-all-around structure. A gate-all-around structure may allow for more effective electrostatic gating.

The shape and position of the shadow region may be controlled by selecting the shape of the bridge portion and the direction of the deposition.

The bridge portion may be configured to cast a shadow on two or more facets of the nanowire. The bridge portion may be configured to surround the nanowire when viewed in plan. It may be desirable to fabricate a semiconductor device having a section which is not coated by the further material. The uncoated section may be useful as a junction, or as a channel of a field effect transistor, for example.

The bridge portion may be ring-shaped in plan and the nanowire may be grown at the centre of the ring shape. It has been found that using a ring-shaped bridge portion allows for the growth of a nanowire of improved quality. Anisotropic conditions at different facets of the nanowire may have negative effects on the growth of the nanowire and the use of a ring-shaped bridge portion may avoid such negative effects.

The method may comprise forming a plurality of shadow walls. By using a plurality of shadow walls, more complex semiconductor devices may be fabricated. For example, a device having more than one junction on a single nanowire may be fabricated. Each shadow wall of the plurality of shadow walls may shadow different facets or combinations of facets, based on the desired structure of the semiconductor device. The shapes of individual shadow walls may be independently selected.

A plurality of nanowires may be grown on the substrate. Two or more of the nanowires may be shadowed by respective shadow walls, or arrays of shadow walls. Deposition of the further material onto individual nanowires may be individually controlled by selecting the shape and position of the shadow walls. This may be useful for fabricating nanowires having different functionalities on the same substrate, which may allow for integration and/or improvements in scalability.

The bridge portion of a shadow wall may include a notch and/or a protrusion. The notch and/or protrusion may modify the shape of the shadow thereby allowing for fabrication of more complex shapes. For example, in implementations where the bridge portion is to shadow multiple facets of the nanowire, different parts of the bridge portion may have different thicknesses to provide different degrees of shadowing to the respective facets.

The method may further comprise, after directionally depositing the layer of further material, removing the shadow wall. Removing the shadow wall may allow for all the easier fabrication of further components.

The removal may be mechanical removal. An example technique for mechanical removal of shadow walls is sonication. Removal of the walls by sonication may comprise placing the device in a liquid bath and applying ultrasonication. Other mechanical methods may be used.

The removal may be partial removal. For example, footprints on the wafer corresponding to the base portions may remain after the removal. Such footprints are generally well-tolerated in any subsequent fabrication steps.

The method may further comprise, after forming the shadow wall, maintaining the substrate in a vacuum until after the directional deposition. A vacuum may be an environment having a pressure of less than or equal to $10^{-6}$ Pa, in particular a pressure less than or equal to $10^{-8}$ Pa.

Since the present method does not require the use of a chemical etch to pattern the further material, the substrate may be maintained in a vacuum throughout the fabrication of the nanowire and the layer of further material. This may allow for easier fabrication of the semiconductor device, since the substrate can remain in the same vacuum chamber does not need to be removed from the vacuum. Avoiding exposure of the nanowire to elevated pressure may help to maintain the quality of the nanowire interface by avoiding reaction with ambient gases, e.g. oxygen.

Preferably, after forming the shadow wall, no chemical etching is performed. Chemical etching may degrade the quality of the nanowire. Chemical etching may be used without restriction prior to the fabrication of the nanowire, for example during the formation of the shadow wall.

The nanowire is typically not cleaved from the substrate. This may improve scalability of the devices obtainable using the method. For example, integrated circuits may be made directly on the same substrate as the nanowires.

Also provided is a semiconductor device obtainable by the method. The device may have an improved interface between the semiconductor and further material compared to a device fabricated by using etching to pattern the further material.

Another aspect provides a semiconductor-superconductor hybrid device, comprising: a planar substrate; a nanowire of semiconductor material having a length, the nanowire extending vertically from the planar substrate; and first and second superconductor components capable of undergoing energy level hybridisation with the semiconductor material; wherein the first superconductor component is arranged on a lower portion of the length of the nanowire; wherein the second superconductor component is arranged on an upper portion of the length of the nanowire; and wherein the first and second superconductor components are vertically spaced from one another, defining a junction portion of the nanowire. The methods provided herein allow for the fabrication of two or more semiconductor-superconductor hybrid portions separated by junction portions on a single, vertically-orientated nanowire. Providing a junction portion is useful for fabricating a practical quantum computing device, such as a qubit, because the junction section may be gated to allow for manipulation of excitations within the hybrid device.

At least one of the first and second superconductor components may be in the form of a full shell surrounding the nanowire. For example, both the first and second superconductor components may be in the form of a full shell. Superconductor components in the form of a full shell may allow for operation of the semiconductor-superconductor hybrid device at lower magnetic field strengths than a device in which only some of the facets of the nanowire are provided with superconductive material.

The semiconductor-superconductor hybrid device may comprise further components. For example, a ferromagnetic insulator layer may be present on one or more sections of the nanowire. In particular, the semiconductor-superconductor hybrid device may further comprise a gate stack for electrostatically gating the junction portion.

The semiconductor-superconductor hybrid device may be embedded in a dielectric filler for supporting the nanowire. The dielectric filler may comprise a polymer, such as poly (methyl methacrylate), hydrogen silsesquioxane, or a propylene glycol monomethyl ether acetate-based photoresist.

A related aspect provides a quantum computing device comprising the semiconductor-superconductor hybrid device as described above.

A still further aspect provides a shadow wall for controlling directional deposition of a material, wherein the shadow wall is arranged on a substrate; wherein the shadow wall comprises a bridge portion and a base portion; wherein the bridge portion overhangs the substrate and the base portion supports the bridge portion; and wherein the bridge portion is ring-shaped in plan. Since the bridge portion of the shadow wall overhangs the substrate, diffusion of adatoms across the surface of the substrate during growth of a semiconductor component is made possible. This may allow for easier growth of a semiconductor nanowire. Since the bridge portion is ring-shaped in plan, anisotropy of growth conditions on different sides of the nanowire may be avoided. This may allow for the growth of a higher quality nanowire.

Also provided is an array of such shadow walls, wherein the ring-shaped bridge portions are concentric. The array of shadow walls may be useful for fabricating a semiconductor device having a plurality of junction portions which are not coated with the further material.

Other variants or use cases of the disclosed techniques may become apparent to the person skilled in the art once given the disclosure herein. The scope of the disclosure is not limited by the described embodiments but only by the accompanying claims.

The invention claimed is:

1. A method of fabricating a semiconductor device on a substrate, which method comprises:
   forming a shadow wall on the substrate;
   subsequently growing a nanowire of semiconductor material on the substrate; and
   directionally depositing a layer of a further material on the nanowire from a direction selected such that the shadow wall casts a shadow on the nanowire, the shadow being a region in which the further material is not deposited;
   wherein the nanowire is vertically orientated with respect to the substrate;
   wherein the shadow wall comprises a base portion and a bridge portion, wherein the bridge portion overhangs the substrate, and the base portion supports the bridge portion; and
   further wherein:
      the bridge portion is configured to cast a shadow on two or more facets of the nanowire; or
      the directional deposition forms a full shell of the further material around an unshadowed portion of the nanowire.

2. The method according to claim 1, wherein the substrate is planar.

3. The method according to claim 1, wherein the nanowire is grown by a vapour-liquid-solid process.

4. The method according to claim 1, wherein the nanowire is grown by a templated growth process.

5. The method according to claim 1, wherein the bridge portion is ring-shaped in plan, and wherein the nanowire is grown at the center of the ring shape.

6. The method according to claim 1, wherein the shadow wall is a first shadow wall, and a plurality of shadow walls, including the first shadow wall, are formed.

7. The method according to claim 1, wherein, after forming the shadow wall, no etching is performed.

8. A semiconductor-superconductor hybrid device, comprising:

a planar substrate;

a nanowire of semiconductor material having a length, the nanowire extending vertically from the planar substrate; and first and second superconductor components capable of undergoing energy level hybridisation with the semiconductor material;

wherein the first superconductor component is arranged on a lower portion of the length of the nanowire;

wherein the second superconductor component is arranged on an upper portion of the length of the nanowire;

wherein the first and second superconductor components are vertically spaced from one another, defining a junction portion of the nanowire; and wherein at least one of the first and second superconductor components is in a form of a full shell surrounding the nanowire.

9. The semiconductor-superconductor hybrid device according to claim 8, further comprising a shadow wall in turn comprising a bridge portion, which overhangs the planar substrate, and a base portion supporting the bridge portion.

10. The semiconductor-superconductor hybrid device according to claim 9, wherein the bridge portion is ring-shaped in plan, and surrounds the nanowire.

11. The semiconductor-superconductor hybrid device according to claim 8, further comprising a gate electrode for gating the junction portion.

12. The semiconductor-superconductor hybrid device according to claim 8, further comprising a dielectric filler for supporting the nanowire.

13. The semiconductor-superconductor hybrid device according to claim 8, wherein the at least one of the first superconductor component or the second superconductor component comprises aluminum, niobium, lead, indium, or tin.

14. A method of fabricating a semiconductor device on a substrate, which method comprises:

forming a shadow wall on the substrate;

subsequently growing a nanowire of semiconductor material on the substrate;

directionally depositing a layer of a further material on the nanowire from a direction selected such that the shadow wall casts a shadow on the nanowire, the shadow being a region in which the further material is not deposited; and after directionally depositing the layer of the further material, removing the shadow wall;

wherein the nanowire is vertically orientated with respect to the substrate; and wherein the shadow wall comprises a base portion and a bridge portion, wherein the bridge portion overhangs the substrate and the base portion supports the bridge portion.

15. The method according to claim 14, wherein the further material is selected from the group consisting of a superconductor material, a metal, and a ferromagnetic insulator material.

16. The method according to claim 14, wherein the further material comprises a superconductor material, which is selected from the group consisting of aluminum, niobium, lead, indium, and tin.

17. The method according to claim 14, further comprising, after forming the shadow wall, maintaining the substrate in a vacuum until after the directional deposition.

18. The method of claim 14, wherein growing the nanowire is performed using a vapour-liquid-solid process, or using a templated growth process.

19. A semiconductor-superconductor hybrid device, comprising:

a shadow wall formed on a substrate;

a nanowire of semiconductor material formed on the substrate, the nanowire being vertically orientated with respect to the substrate; and a layer of a further material on the nanowire adjacent to a shadow region in which the further material is not deposited, the shadow region defined as a shadow of the shadow wall on the nanowire along a deposition direction;

wherein the shadow wall comprises a base portion and a bridge portion, wherein the bridge portion overhangs the substrate, the base portion supports the bridge portion, and the shadow region lies over two or more facets of the nanowire.

20. The semiconductor-superconductor hybrid device according to claim 19, wherein the bridge portion includes a notch and/or a protrusion.

21. The semiconductor-superconductor hybrid device of claim 19, wherein the substrate is planar.

22. The semiconductor-superconductor hybrid device of claim 19, wherein the bridge portion of the shadow wall comprises a notch.

23. The semiconductor-superconductor hybrid device of claim 19, wherein the bridge portion of the shadow wall comprises a protrusion.

24. The semiconductor-superconductor hybrid device of claim 19, wherein the layer of further material is a full shell around the nanowire.

25. The semiconductor-superconductor hybrid device of claim 19, wherein the semiconductor material comprises a III-V material.

26. The semiconductor-superconductor hybrid device of claim 19, wherein the semiconductor material comprises a II-VI material.

* * * * *